(12) United States Patent
Lu

(10) Patent No.: US 11,550,424 B2
(45) Date of Patent: Jan. 10, 2023

(54) OLED TOUCH CONTROL DISPLAY DEVICE AND DRIVING METHOD THEREOF

(71) Applicant: SHENZHEN CHINA STAR OPTOELECTRONICS SEMICONDUCTOR DISPLAY TECHNOLOGY CO., LTD., Shenzhen (CN)

(72) Inventor: Wei Lu, Shenzhen (CN)

(73) Assignee: Shenzhen China Star Optoelectronics Semiconductor Display Technology Co., Ltd., Guangdong (CN)

( * ) Notice: Subject to any disclaimer, the term of this patent is extended or adjusted under 35 U.S.C. 154(b) by 228 days.

(21) Appl. No.: 16/619,618

(22) PCT Filed: Aug. 9, 2019

(86) PCT No.: PCT/CN2019/099987
§ 371 (c)(1),
(2) Date: Dec. 5, 2019

(87) PCT Pub. No.: WO2020/220508
PCT Pub. Date: Nov. 5, 2020

(65) Prior Publication Data
US 2021/0326022 A1 Oct. 21, 2021

(30) Foreign Application Priority Data

Apr. 28, 2019 (CN) .......................... 201910351797.2

(51) Int. Cl.
*G06F 3/041* (2006.01)
*G09G 3/3225* (2016.01)
(Continued)

(52) U.S. Cl.
CPC ........ *G06F 3/04166* (2019.05); *G06F 3/0412* (2013.01); *G09G 3/3225* (2013.01);
(Continued)

(58) Field of Classification Search
CPC ............... G06F 3/04166; G06F 3/0412; G06F 3/044–0448; G09G 3/3266;
(Continued)

(56) References Cited

U.S. PATENT DOCUMENTS

2015/0042614 A1* 2/2015 Pak ...................... G06F 3/0412
345/174
2016/0216800 A1* 7/2016 Cho ..................... G09G 3/3291
(Continued)

*Primary Examiner* — David Tung
(74) *Attorney, Agent, or Firm* — PV IP PC; Wei Te Chung; Ude Lu

(57) ABSTRACT

The present invention discloses an OLED touch control display device and driving method thereof. The OLED touch control device of the present disclosure sets a transparent touch control electrode and a second thin film transistor in the pixels, a gate of the second thin film transistor is connected to a scanning line corresponding to the pixels, a source is coupled to the touch control lines, a drain is coupled to the touch control electrode. During driving state, a scanning signal is sequentially transmitted to the plurality of scanning lines in each frame period, and a touch control chip used to charge the plurality of touch control lines in one of two adjacent frame periods, and receive a touch control signal transmitted by the plurality of touch control lines in the other of any two adjacent frame periods, thereby achieving high-sensitivity touch sensing, high module yield, and low product cost.

8 Claims, 2 Drawing Sheets

(51) Int. Cl.
   *G09G 3/3266*   (2016.01)
   *G09G 3/3275*   (2016.01)
   *H01L 27/32*    (2006.01)

(52) U.S. Cl.
   CPC ......... *G09G 3/3266* (2013.01); *G09G 3/3275* (2013.01); *H01L 27/323* (2013.01); *G09G 2300/0452* (2013.01); *G09G 2300/0809* (2013.01)

(58) Field of Classification Search
   CPC ............... G09G 3/3225; G09G 3/3275; G09G 2300/0452; G09G 2300/0809
   See application file for complete search history.

(56) References Cited

U.S. PATENT DOCUMENTS

| | | | |
|---|---|---|---|
| 2018/0143729 A1* | 5/2018 | Lee | G06F 3/0416 |
| 2019/0043927 A1* | 2/2019 | Jang | H01L 27/323 |

\* cited by examiner

OLED TOUCH CONTROL DISPLAY DEVICE AND DRIVING METHOD THEREOF

CROSS-REFERENCE TO RELATED APPLICATIONS

This is the U.S. National Stage of International Patent Application No. PCT/CN2019/099987, filed Aug. 9, 2019, which in turn claims the benefit of Chinese Patent Application No. 201910351797.2, filed Apr. 28, 2019.

FIELD OF INVENTION

The disclosure relates to the display technology field, and more particularly, to an OLED touch control display device and driving method thereof.

BACKGROUND OF INVENTION

Organic light emitting displays (OLED) have many advantages, such as self-illumination, low driving voltage, high luminous efficiency, short response times, high resolution and contrast, nearly 180° viewing angles, wide operating temperature range, flexible display, and large-area full-color display etc., and recognized by the industry as the most promising display device.

According to driving methods, OLED can be divided into two types: passive matrix OLEDs (PMOLEDs) and active matrix OLEDs (AMOLEDs), namely direct addressing and thin film transistor (TFT) matrix addressing. Wherein, AMOLED has pixels arranged in an array, which is an active display type, has high luminous efficiency, and is generally used on high-resolution large-sized display devices.

OLED devices generally include a substrate, an anode disposed on the substrate, a hole injection layer disposed on the anode, a hole transport layer disposed on the hole injection layer, and a luminous layer disposed on the hole transport layer, an electron transport layer on the luminous layer, an electron injecting layer disposed on the electron transporting layer, and a cathode disposed on the electron injecting layer. The principle of illumination of OLED devices is that semiconductor materials and organic luminous materials are driven by electric fields, causing luminescence by carrier injection and recombination.

Specifically, OLED devices generally use an ITO electrode and a metal electrode respectively as the anode and cathode of the device, under driven by a certain voltage, electrons and electron holes are injected respectively from the cathode and the anode to the electron transport layer and the electron hole transport layer, the electrons and the electron holes migrate to the luminous layer respectively through the electron transport layer and the electron hole transport layer, and meet in the luminous layer to form excitons and excite the luminescent molecules, which emit visible light through radiation relaxation.

In the prior art, if the OLED display devices are required to have a touch control function, a full-fit touch control technology or an on-cell touch control technology is generally adopted. Both of technologies have problems such as large signal noise, low touch control sensitivity, and low final module yield, which ultimately leads to high product cost and poor user touch control experience.

SUMMARY OF INVENTION

The object of the present disclosure is that provides an OLED touch control display device, which can reduce product cost and improve touch control sensitivity, module yield, and touch control effect.

The other object of the present disclosure is that provides a driving method of the OLED touch control display device, which can improve touch control sensitivity and touch control effect.

To achieve the above object, the present disclosure first provides an OLED touch control display device comprising a substrate, a plurality of pixels disposed on the substrate, a plurality of scanning lines disposed on the substrate, a plurality of data lines disposed on the substrate, a plurality of touch control lines disposed on the substrate, and a touch control chip coupled to the plurality of touch control lines.

The plurality of pixels arranged in an array, each column of pixels corresponds to one of the data lines and one of the touch control lines, and each row of pixels corresponds to one of the scanning lines. Each of pixels comprises a TFT device layer disposed on the substrate, a transparent touch control electrode disposed on the substrate and adjacent to the TFT device layer, and a transparent anode disposed on the TFT device layer. The TFT device layer comprises a first thin film transistor and a second thin film transistor, a gate of the first thin film transistor coupled to the corresponding scanning line, a source of the first thin film transistor coupled to the corresponding data line, a drain of the first thin film transistor coupled to the anode. A gate of the second thin film transistor coupled to the corresponding scanning line, a source of the first thin film transistor coupled to the corresponding touch control line, a drain of the second thin film transistor coupled to the touch control electrode.

The touch control chip is used to charge the plurality of touch control lines in one of two adjacent frame periods of the OLED touch display device, and receive touch control signal transmitted by the plurality of touch control lines in the other of any two adjacent frame periods of the OLED touch display device.

The OLED touch control display device further comprise a gate driving chip coupled to the plurality of scanning lines, and a source driving chip coupled to the plurality of data lines, the gate driving chip is used to transmit in sequence a scanning signal to the plurality of scanning lines in each frame period of the OLED touch control display device, the source driving chip is used to transmit data signal to the plurality of data lines.

Materials of the touch control electrode and the anode are ITO, IZO, or magnesium silver alloy, and material of the substrate is glass.

Each of pixels comprises a pixel definition layer disposed on the TFT device layer and the anode, a luminous layer disposed on the anode, and a reflective cathode disposed on the luminous layer and the pixel definition layer. An opening of the pixel definition layer disposed above the anode, and the luminous layer located in the opening.

The plurality of pixels comprise a red pixel, a green pixel, and a blue pixel alternately arranged in sequence. A red-light luminous layer is a luminous layer in the red pixel, a green-light luminous layer is a luminous layer in the green pixel, a blue-light luminous layer is a luminous layer in the blue pixel.

To achieve the above object, the present disclosure provides a driving method of the OLED touch control display device, comprising steps as below:

Step S1: providing an OLED touch control display device.

The OLED touch control display device comprises a substrate, a plurality of pixels disposed on the substrate, a plurality of scanning lines disposed on the substrate, a plurality of data lines disposed on the substrate, a plurality of touch control lines disposed on the substrate, and a touch control chip coupled to the plurality of touch control lines.

The plurality of pixels arranged in an array, each column of pixels corresponds to one of the data lines and one of the touch control lines, and each row of pixels corresponds to one of the scanning lines. Each of pixels comprises a TFT device layer disposed on the substrate, a transparent touch control electrode disposed on the substrate and adjacent to the TFT device layer, and a transparent anode disposed on the TFT device layer. The TFT device layer comprises a first thin film transistor and a second thin film transistor, a gate of the first thin film transistor coupled to the corresponding scanning line, a source of the first thin film transistor coupled to the corresponding data line, a drain of the first thin film transistor coupled to the anode; a gate of the second thin film transistor coupled to the corresponding scanning line, a source of the first thin film transistor coupled to the corresponding touch control line, a drain of the second thin film transistor coupled to the touch control electrode.

Step S2: going to the ith frame period, wherein i is a positive integer.

A scanning signal is in sequence transmitted to the plurality of scanning lines to in sequence control conduction of the first thin film transistor and the second thin film transistor in a plurality of rows of pixels, the touch control chip is used to charge the plurality of touch control lines, thereby charging the touch control electrode in all pixels.

Step S3: going to (i+i)th frame period.

A scanning signal is in sequence transmitted to the plurality of scanning lines to in sequence control conduction of the first thin film transistor and the second thin film transistor in a plurality of rows of pixels, the touch control chip receives a touch control signal transmitted by the plurality of touch control lines to obtain a discharge magnitude or a voltage of each touch control electrodes, the position of the touch electrode is determined by the difference between the discharge magnitude or the voltage and the preset reference value as the touch control position.

The OLED touch control display device further comprises a gate driving chip coupled to the plurality of scanning lines, and a source driving chip coupled to the plurality of data lines.

In step S2 and step S3, the gate driving chip is used to transmit in sequence a scanning signal to the plurality of scanning lines, the source driving chip is used to transmit data signal to the plurality of data lines.

Materials of the touch control electrode and the anode are ITO, IZO, or magnesium silver alloy, and material of the substrate is glass.

Each of pixels comprises a pixel definition layer disposed on the TFT device layer and the anode, a luminous layer disposed on the anode, and a reflective cathode disposed on the luminous layer and the pixel definition layer. An opening of the pixel definition layer disposed above the anode, and the luminous layer located in the opening.

The plurality of pixels comprise a red pixel, a green pixel, and a blue pixel alternately arranged in sequence. A red-light luminous layer is a luminous layer in the red pixel, a green-light luminous layer is a luminous layer in the green pixel, a blue-light luminous layer is a luminous layer in the blue pixel.

To achieve the above object, the present disclosure provides a driving method of the OLED touch control display device, comprising steps as below:

Step S1: providing an OLED touch control display device.

The OLED touch control display device comprises a substrate, a plurality of pixels disposed on the substrate, a plurality of scanning lines disposed on the substrate, a plurality of data lines disposed on the substrate, a plurality of touch control lines disposed on the substrate, and a touch control chip coupled to the plurality of touch control lines.

The plurality of pixels arranged in an array, each column of pixels corresponds to one of the data lines and one of the touch control lines, and each row of pixels corresponds to one of the scanning lines. Each of pixels comprises a TFT device layer disposed on the substrate, a transparent touch control electrode disposed on the substrate and adjacent to the TFT device layer, and a transparent anode disposed on the TFT device layer. The TFT device layer comprises a first thin film transistor and a second thin film transistor, a gate of the first thin film transistor coupled to the corresponding scanning line, a source of the first thin film transistor coupled to the corresponding data line, a drain of the first thin film transistor coupled to the anode; a gate of the second thin film transistor coupled to the corresponding scanning line, a source of the first thin film transistor coupled to the corresponding touch control line, a drain of the second thin film transistor coupled to the touch control electrode.

Step S2: going to the ith frame period, wherein i is a positive integer.

A scanning signal is in sequence transmitted to the plurality of scanning lines to in sequence control conduction of the first thin film transistor and the second thin film transistor in a plurality of rows of pixels, the touch control chip is used to charge the plurality of touch control lines, thereby charging the touch control electrode in all pixels.

Step S3: going to (i+i)th frame period.

A scanning signal is in sequence transmitted to the plurality of scanning lines to in sequence control conduction of the first thin film transistor and the second thin film transistor in a plurality of rows of pixels, the touch control chip receives a touch control signal transmitted by the plurality of touch control lines to obtain a discharge magnitude or a voltage of each touch control electrodes, the position of the touch electrode is determined by the difference between the discharge magnitude or the voltage and the preset reference value as the touch control position.

The OLED touch control display device further comprises a gate driving chip coupled to the plurality of scanning lines, and a source driving chip coupled to the plurality of data lines.

In step S2 and step S3, the gate driving chip is used to transmit in sequence a scanning signal to the plurality of scanning lines, the source driving chip is used to transmit data signal to the plurality of data lines.

Materials of the touch control electrode and the anode are ITO, IZO, or magnesium silver alloy, and material of the substrate is glass.

The advantageous effects of the present disclosure: the OLED touch control device of the present disclosure sets a transparent touch control electrode and a second thin film transistor in the pixels, a gate of the second thin film transistor is connected to a scanning line corresponding to the pixels, a source of the second thin film transistor is coupled to the touch control lines, a drain of the second thin film transistor is coupled to the touch control electrode. During driving state, a scanning signal is in sequence transmitted to the plurality of scanning lines in each frame period, and a touch control chip is used to charge the plurality of touch control lines in one of two adjacent frame periods, and receive a touch control signal transmitted by the plurality of touch control lines in the other of any two adjacent frame periods, thereby achieving high-sensitivity touch sensing, high module yield, and low product cost. A driving method of the OLED touch control display device improve touch control sensitivity and touch control effect.

DESCRIPTION OF DRAWINGS

In order to better understand the characteristics and technical aspect of the invention, please refer to the following detailed description of the present invention is concerned with the diagrams, however, provide reference to the accompanying drawings and description only and is not intended to be limiting of the invention.

DETAILED DESCRIPTION OF PREFERRED EMBODIMENTS

For better explaining the technical solution and the effect of the present invention, the present invention will be further described in detail with the accompanying drawings and the specific embodiments.

Figure 1:
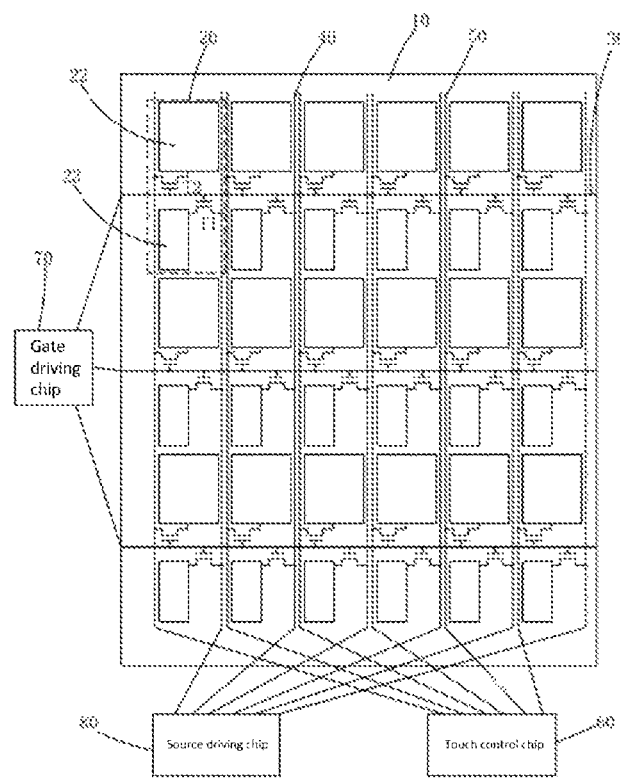
FIG. 1 is a schematic structural diagram of OLED touch control display device of the present disclosure.
Figure 2:
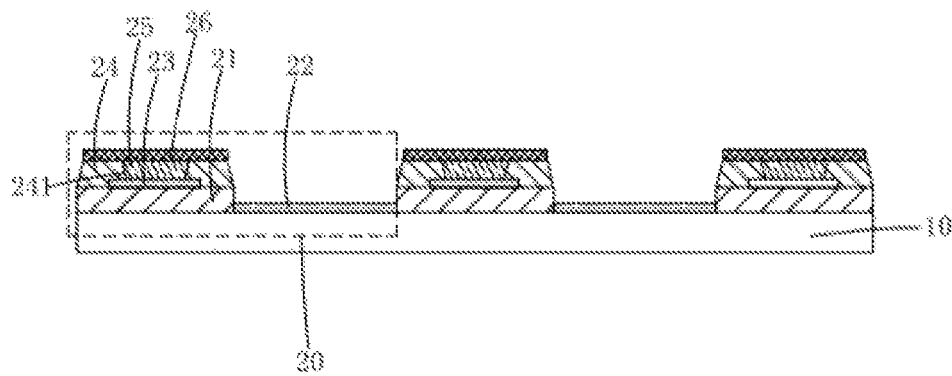
FIG. 2 is a sectional schematic view of the plurality of pixels of OLED touch control display device of the present disclosure.

Referring to FIG. 1 and FIG. 2, the present disclosure provides an OLED touch control display device comprising a substrate 10, a plurality of pixels 20 disposed on the substrate 10, a plurality of scanning lines 30 disposed on the substrate 10, a plurality of data lines 40 disposed on the substrate 10, a plurality of touch control lines 50 disposed on the substrate 10, and a touch control chip 60 coupled to the plurality of touch control lines 50.

The plurality of pixels 20 are arranged in an array, each column of pixels 20 corresponds to one of the data lines 40 and one of the touch control lines 50, and each row of pixels 20 corresponds to one of the scanning lines 30. Each of pixels 20 comprises a TFT device layer 21 disposed on the substrate 10, a transparent touch control electrode 22 disposed on the substrate 10 and adjacent to the TFT device layer 21, and a transparent anode 23 disposed on the TFT device layer 21. The TFT device layer 21 comprises a first thin film transistor T1 and a second thin film transistor T2, a gate of the first thin film transistor T1 coupled to the corresponding scanning lines 30, a source of the first thin film transistor T1 coupled to the corresponding data lines 40, a drain of the first thin film transistor T1 coupled to the anode 23. A gate of the second thin film transistor T2 coupled to the corresponding scanning lines 30, a source of the second thin film transistor T2 coupled to the corresponding touch control lines 50, a drain of the second thin film transistor T2 coupled to the touch control electrode 22. An area where the touch control electrode 22 located in the OLED touch control display device is transparent, which makes the OLED touch control display device of the present disclosure be transparent touch control display device.

The touch control chip 60 is used to charge the plurality of touch control lines 50 in one of two adjacent frame periods of the OLED touch display device, and receive a touch control signal transmitted by the plurality of touch control lines 50 in the other of any two adjacent frame periods of the OLED touch display device.

Specifically, the OLED touch control display device further comprise a gate driving chip 70 coupled to the plurality of scanning lines 30, and a source driving chip 80 coupled to the plurality of data lines 40. The gate driving chip 70 is used to transmit in sequence a scanning signal to the plurality of scanning lines 30 in each frame period of the OLED touch control display device. The source driving chip 80 is used to transmit data signal to the plurality of data lines 40.

Specifically, materials of the touch control electrode and the anode are same, and both are ITO, IZO, or magnesium silver alloy.

Specifically, material of the substrate is glass.

Specifically, each of pixels 20 comprises a pixel definition layer 24 disposed on the TFT device layer 21 and the anode 23, a luminous layer 25 disposed on the anode 23, and a reflective cathode 26 disposed on the luminous layer 25 and the pixel definition layer 24. An opening 241 of the pixel definition layer 24 disposed above the anode 23, and the luminous layer 25 located in the opening 241. The anode 23, the luminous layer 25 above the anode 23, and the cathode 26 constitute an OLED device.

Specifically, the plurality of pixels 20 comprise a red pixel, a green pixel, and a blue pixel alternately arranged in sequence. A red-light luminous layer is a luminous layer 25 in the red pixel, a green-light luminous layer is a luminous layer 25 in the green pixel, a blue-light luminous layer is a luminous layer 25 in the blue pixel.

Specifically, the OLED touch control display device further comprises a display data processing system coupled to the source driving chip 80 and a touch control processing system coupled to the touch control chip 60.

Specifically, when the OLED touch control display device is manufactured, the TFT device layer 21, the scanning lines 30, the data lines 40, the touch control lines 50 are manufactured on the substrate 10, and then the anode 23 is manufactured on the TFT array layer 21 and the touch control electrode 22 is manufactured on the substrate 10 at the same time. Subsequently, when the luminous layer 25 and the cathode 26 are manufactured on the anode 23, the touch control electrode 22 is shielded by the mask, and then the OLED device is packaged. Finally, the touch control chip 60 is bonded to the plurality of touch control lines 50, the source driving chip 80 is bonded to the plurality of data lines 40, and the gate driving chip 70 is bonded to the plurality of scanning lines 30.

It should be noted that, the OLED touch control device of the present disclosure sets a transparent touch control electrode 22 and a second thin film transistor T2 in the pixels 20, a gate of the second thin film transistor T2 is connected to a scanning lines 30 corresponding to the pixels 20, a source of the second thin film transistor T2 is coupled to the touch control lines 50, a drain of the second thin film transistor T2 is coupled to the touch control electrode 22. During driving state, a scanning signal is in sequence transmitted to the plurality of scanning lines 30 in each frame period to in sequence control conduction of the first thin film transistor T1 and the second thin film transistor T2, the touch control chip 60 is used to charge the plurality of touch control lines 50 in one of two adjacent frame periods, thereby charging the touch control electrode 22 in all pixels 20, and receive a touch control signal transmitted by the plurality of touch control lines in the other of any two adjacent frame periods to obtain a discharge magnitude or a voltage of each touch control electrodes 22, the position (expressed in horizontal and vertical coordinates) of the touch electrode is determined by the difference between the discharge magnitude or the voltage and the preset reference value as the touch control position, thereby achieving high-sensitivity touch sensing, high module yield, and low product cost.

Figure 3:
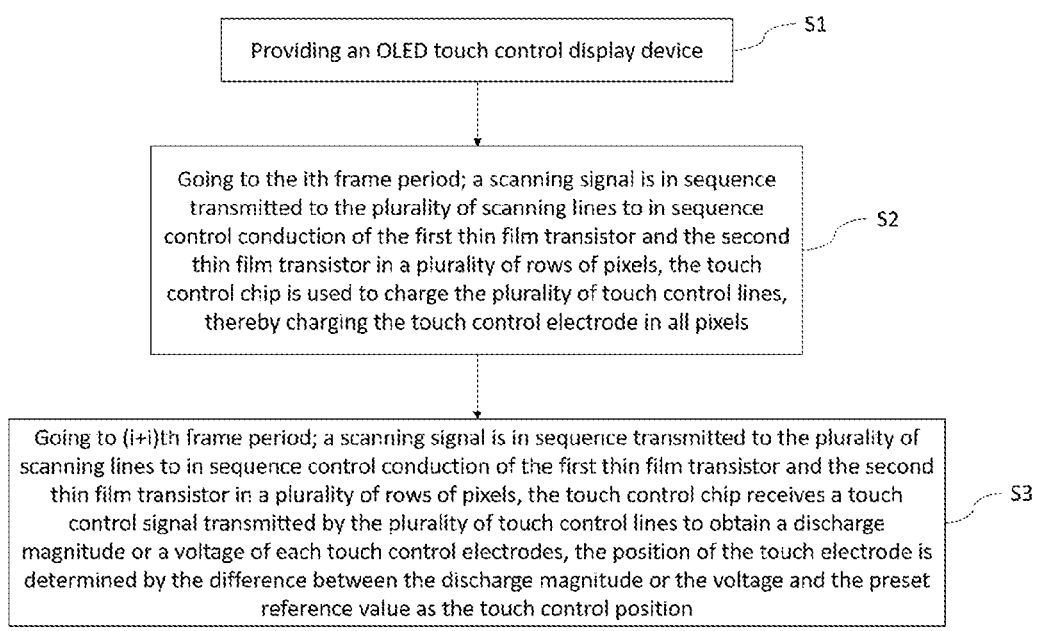
FIG. 3 is a flow-chart of driving method of OLED touch control display device of the present disclosure.

Referring to FIG. 3, based on the same inventive concept, the disclosure provides a driving method of the OLED touch control display device, comprising steps as below:

Step S1: referring to FIG. 1 and FIG. 2, providing an OLED touch control display device.

The touch control display device comprises a substrate 10, a plurality of pixels 20 disposed on the substrate 10, a plurality of scanning lines 30 disposed on the substrate 10, a plurality of data lines 40 disposed on the substrate 10, a plurality of touch control lines 50 disposed on the substrate 10, and a touch control chip 60 coupled to the plurality of touch control lines 50.

The plurality of pixels 20 arranged in an array, each column of pixels 20 corresponds to one of the data lines 40 and one of the touch control lines 50, and each row of pixels 20 corresponds to one of the scanning lines 30. Each of pixels 20 comprises a TFT device layer 21 disposed on the substrate 10, a transparent touch control electrode 22 disposed on the substrate 10 and adjacent to the TFT device layer 21, and a transparent anode 23 disposed on the TFT device layer 21. The TFT device layer 21 comprises a first thin film transistor T1 and a second thin film transistor T2, a gate of the first thin film transistor T1 coupled to the corresponding scanning lines 30, a source of the first thin film transistor T1 coupled to the corresponding data lines 40, a drain of the first thin film transistor T1 coupled to the anode 23. A gate of the second thin film transistor T2 coupled to the corresponding scanning lines 30, a source of the second thin film transistor T2 coupled to the corresponding touch control lines 50, a drain of the second thin film transistor coupled to the touch control electrode 22.

Specifically, the OLED touch control display device further comprise a gate driving chip 70 coupled to the plurality of scanning lines 30, and a source driving chip 80 coupled to the plurality of data lines 40.

Specifically, materials of the touch control electrode and the anode are same, and both are ITO, IZO, or magnesium silver alloy.

Specifically, material of the substrate is glass.

Specifically, each of pixels 20 comprises a pixel definition layer 24 disposed on the TFT device layer 21 and the anode 23, a luminous layer 25 disposed on the anode 23, and a reflective cathode 26 disposed on the luminous layer 25 and the pixel definition layer 24. An opening 241 of the pixel definition layer 24 disposed above the anode 23, and the luminous layer 25 located in the opening 241. The anode 23, the luminous layer 25 above the anode 23, and the cathode 26 are constituted an OLED device.

Specifically, the plurality of pixels 20 comprise a red pixel, a green pixel, and a blue pixel alternately arranged in sequence. A red-light luminous layer is a luminous layer 25 in the red pixel, a green-light luminous layer is a luminous layer 25 in the green pixel, a blue-light luminous layer is a luminous layer 25 in the blue pixel.

Specifically, the OLED touch control display device further comprises a display data processing system (not shown) coupled to the source driving chip 80 and a touch control processing system (not shown) coupled to the touch control chip 60.

Step S2: going to the ith frame period, wherein i is a positive integer.

A scanning signal is in sequence transmitted to the plurality of scanning lines 30 to in sequence control conduction of the first thin film transistor and the second thin film transistor in a plurality of rows of pixels, the touch control chip 60 is used to charge the plurality of touch control lines, thereby charging the touch control electrode in all pixels.

Specifically, in Step S2, the gate driving chip 70 used to transmit in sequence a scanning signal to the plurality of scanning lines 30, the source driving chip 80 is used to transmit a data signal to the plurality of data lines 40.

Step S3: going to (i+i)th frame period.

A scanning signal is in sequence transmitted to the plurality of scanning lines 30 to in sequence control conduction of the first thin film transistor T1 and the second thin film transistor T2 in a plurality of rows of pixels 20, the touch control chip 60 receives a touch control signal transmitted by the plurality of touch control lines 50 to obtain a discharge magnitude or a voltage of each touch control electrode 22, the position of the touch electrode 22 is determined by the difference between the discharge magnitude or the voltage and the preset reference value as the touch control position.

Specifically, in Step S3, the gate driving chip 70 is used to transmit in sequence a scanning signal to the plurality of scanning lines 30, the source driving chip 80 is used to transmit a data signal to the plurality of data lines 40.

It should be noted that, the driving method of the OLED touch control display device of the present disclosure is applied to the above OLED touch control display device. During the ith frame period, a scanning signal is in sequence transmitted to the plurality of scanning lines 30 to in sequence control conduction of the first thin film transistor T1 and the second thin film transistor T2 in a plurality of rows of pixels 20, the touch control chip 60 is used to charge the plurality of touch control lines 50, thereby charging the touch control electrode 22 in all pixels 20. During the (i+i)th frame period, a scanning signal is in sequence transmitted to the plurality of scanning lines 30 to in sequence control conduction of the first thin film transistor T1 and the second thin film transistor T2 in a plurality of rows of pixels 20, the touch control chip 60 receives a touch control signal transmitted by the plurality of touch control lines 50 to obtain a discharge magnitude or a voltage of each touch control electrode 22, the position (expressed in horizontal and vertical coordinates) of the touch electrode 22 is determined by the difference between the discharge magnitude or the voltage and the preset reference value as the touch control position, thereby achieving high-sensitivity touch sensing.

As mentioned above, the OLED touch control device of the present disclosure sets a transparent touch control electrode and a second thin film transistor in the pixels, a gate of the second thin film transistor is connected to a scanning line corresponding to the pixels, a source of the second thin film transistor is coupled to the touch control lines, a drain of the second thin film transistor is coupled to the touch control electrode. During driving state, a scanning signal is in sequence transmitted to the plurality of scanning lines in each frame period, and a touch control chip is used to charge the plurality of touch control lines in one of two adjacent frame periods, and receive a touch control signal transmitted by the plurality of touch control lines in the other of any two adjacent frame periods, thereby achieving high-sensitivity touch sensing, high module yield, and low product cost. A driving method of the OLED touch control display device improve touch control sensitivity and touch control effect.

Based on the description given above, those having ordinary skills of the art may easily contemplate various changes and modifications of the technical solution and technical ideas of the present invention and all these changes and modifications are considered within the protection scope of right for the present invention.

What is claimed is:

1. An organic light-emitting diode (OLED) touch control display device, comprising:
    a substrate, a plurality of pixels disposed on the substrate, a plurality of transparent touch control electrodes attached to the substrate, a plurality of scanning lines disposed on the substrate, a plurality of data lines disposed on the substrate, a plurality of touch control lines disposed on the substrate, a touch control chip coupled to the plurality of touch control lines; a gate driving chip coupled to the plurality of scanning lines, and a source driving chip coupled to the plurality of data lines;
    the plurality of pixels are arranged in an array, each column of pixels corresponds to one of the data lines and one of the touch control lines; and each row of pixels corresponds to one of the scanning lines;
    each of pixels comprises a thin film transistor (TFT) device layer disposed on the substrate and a transparent anode disposed on the TFT device layer; and
    the TFT device layer comprises a first thin film transistor and a second thin film transistor, a gate of the first thin film transistor coupled to the corresponding scanning line, a source of the first thin film transistor coupled to the corresponding data line, a drain of the first thin film transistor coupled to the anode; a gate of the second thin film transistor coupled to the corresponding scanning line, a source of the second thin film transistor coupled to the corresponding touch control line, a drain of the second thin film transistor coupled to the touch control electrode;
    the touch control chip used to charge the plurality of touch control electrodes in one of two adjacent frame periods of the OLED touch display device, and receive a touch control signal transmitted by the plurality of touch control lines from the touch control electrodes in the other of any two adjacent frame periods of the OLED touch display device, wherein each of the touch control electrodes is adjacent to one of the TFT device layers;
    the gate driving chip used to transmit in sequence a scanning signal to the plurality of scanning lines in each frame period of the OLED touch control display device;
    the source driving chip used to transmit data signal to the plurality of data lines;
    wherein timing to start charging of each of the touch control electrodes is controlled by the gate driving chip;
    wherein each of pixels comprises a pixel definition layer disposed on the TFT device layer and the anode, a luminous layer disposed on the anode, and a reflective cathode disposed on the luminous layer and the pixel definition layer; an opening of the pixel definition layer disposed above the anode, and the luminous layer located in the opening;
    wherein the corresponding scanning line is positioned between the first thin film transistor and the second thin film transistor.

2. The OLED touch control display device as claimed in claim 1, wherein, materials of the touch control electrode and the anode are ITO, IZO, or magnesium silver alloy; material of the substrate is glass.

3. The OLED touch control display device as claimed in claim 1, wherein, the plurality of pixels comprise a red pixel, a green pixel, and a blue pixel alternately arranged in sequence;
    a red-light luminous layer is a luminous layer in the red pixel, a green-light luminous layer is a luminous layer in the green pixel, a blue-light luminous layer is a luminous layer in the blue pixel.

4. A driving method of the organic light-emitting diode (PLED) touch control display device, comprising steps as below:
    S1: providing an OLED touch control display device;
    the OLED touch control display device comprising a substrate, a plurality of pixels disposed on the substrate, a plurality of transparent touch control electrodes attached to the substrate, a plurality of scanning lines disposed on the substrate, a plurality of data lines disposed on the substrate, a plurality of touch control lines disposed on the substrate, a touch control chip coupled to the plurality of touch control lines, a gate driving chip coupled to the plurality of scanning lines, and a source driving chip coupled to the plurality of data lines; the plurality of pixels arranged in an array, each column of pixels corresponds to one of the data lines and one of the touch control lines, and each row of pixels corresponds to one of the scanning lines; each of pixels comprises a thin film transistor (TFT) device layer disposed on the substrate, and a transparent anode disposed on the TFT device layer; the TFT device layer comprises a first thin film transistor and a second thin film transistor, a gate of the first thin film transistor coupled to the corresponding scanning line, a source of the first thin film transistor coupled to the corresponding data line, a drain of the first thin film transistor coupled to the anode; a gate of the second thin film transistor coupled to the corresponding scanning line, a source of the second thin film transistor coupled to the corresponding touch control line, a drain of the second thin film transistor coupled to the touch control electrode; each of the transparent touch control electrodes adjacent to one of the TFT device layers;
    S2: going to the ith frame period, wherein i is a positive integer;
    the plurality of scanning lines in sequence transmit a scanning signal to in sequence control conduction of the first thin film transistor and the second thin film transistor in a plurality of rows of pixels, the touch control chip charge the plurality of touch control electrodes, thereby charging the touch control electrode in all pixels;
    S3: going to (i+1)th frame period;
    the plurality of scanning lines in sequence transmit scanning signal to in sequence control conduction of the first thin film transistor and the second thin film transistor in a plurality of rows of pixels, the touch control chip receives a touch control signal transmitted by the plurality of touch control lines from the touch control electrodes to obtain a discharge magnitude or a voltage of each touch control electrode, the position of the touch electrode is determined by the difference between the discharge magnitude or the voltage and the preset reference value as the touch position;
    in S2 and S3, the gate driving chip used to transmit in sequence scanning signal to the plurality of scanning lines, the source driving chip used to transmit data signal to the plurality of data lines;

wherein timing to start charging of each of the touch control electrodes is controlled by the gate driving chip;

wherein each of pixels comprises a pixel definition layer disposed on the TFT device layer and the anode, a luminous layer disposed on the anode, and a reflective cathode disposed on the luminous layer and the pixel definition layer; an opening of the pixel definition layer disposed above the anode, and the luminous layer located in the opening;

wherein the corresponding scanning line is positioned between the first thin him transistor and the second thin film transistor.

5. The driving method of the OLED touch control display device as claimed in claim 4, wherein, materials of the touch control electrode and the anode are ITO, IZO, or magnesium silver alloy; material of the substrate is glass.

6. The driving method of the OLED touch control display device as claimed in claim 4, wherein, the plurality of pixels comprise a red pixel, a green pixel, and a blue pixel alternately arranged in sequence;

a red-light luminous layer is a luminous layer in the red pixel, a green-light luminous layer is a luminous layer in the green pixel, a blue-light luminous layer is a luminous layer in the blue pixel.

7. A driving method of the OLED touch control display device, comprising steps as below:

S1: providing an OLED touch control display device;

the OLED touch control display device comprising a substrate, a plurality of pixels disposed on the substrate, a plurality of transparent touch control electrodes attached to the substrate, a plurality of scanning lines disposed on the substrate, a plurality of data lines disposed on the substrate, a plurality of touch control lines disposed on the substrate, a touch control chip coupled to the plurality of touch control lines, a gate driving chip coupled to the plurality of scanning lines, and a source driving chip coupled to the plurality of data lines; the plurality of pixels arranged in an array, each column of pixels corresponds to one of the data lines and one of the touch control lines, and each row of pixels corresponds to one of the scanning lines; each of pixels comprises a thin film transistor (TFT) device layer disposed on the substrate, and a transparent anode disposed on the TFT device layer; the TFT device layer comprises a first thin film transistor and a second thin film transistor, a gate of the first thin film transistor coupled to the corresponding scanning line, a source of the first thin film transistor coupled to the corresponding data line, a drain of the first thin film transistor coupled to the anode; a gate of the second thin film transistor coupled to the corresponding scanning line, a source of the second thin film transistor coupled to the corresponding touch control line, a drain of the second thin film transistor coupled to the touch control electrode; each of the transparent touch control electrodes adjacent to one of the TFT device layers;

S2: going to the ith frame period, wherein i is a positive integer;

the plurality of scanning lines in sequence transmit scanning signal to in sequence control conduction of the first thin film transistor and the second thin film transistor in a plurality of rows of pixels, the touch control chip charge the plurality of touch control electrodes, thereby charging the touch control electrode in all pixels;

S3: going to (i+1)th frame period;

the plurality of scanning lines in sequence transmit scanning signal to in sequence control conduction of the first thin film transistor and the second thin film transistor in a plurality of rows of pixels, the touch control chip receives a touch control signal transmitted by the plurality of touch control lines from the touch control electrodes to obtain a discharge magnitude or a voltage of each touch control electrode, the position of the touch electrode is determined by the difference between the discharge magnitude or the voltage and the preset reference value as the touch position;

in S2 and S3, the gate driving chip used to transmit in sequence scanning signal to the plurality of scanning lines, the source driving chip used to transmit data signal to the plurality of data lines;

wherein timing to start charging of each of the touch control electrodes is controlled by the gate driving chip;

wherein, materials of the touch control electrode and the anode are ITO, IZO, or magnesium silver alloy; material of the substrate is glass;

wherein each of pixels comprises a pixel definition layer disposed on the TFT device layer and the anode, a luminous layer disposed on the anode, and a reflective cathode disposed on the luminous layer and the pixel definition layer; an opening of the pixel definition layer disposed above the anode, and the luminous layer located in the opening;

wherein the corresponding scanning line is positioned between the first thin film transistor and the second thin film transistor.

8. The driving method of the OLED touch control display device as claimed in claim 7, wherein, the plurality of pixels comprise a red pixel, a green pixel, and a blue pixel alternately arranged in sequence;

a red-light luminous layer is a luminous layer in the red pixel, a green-light luminous layer is a luminous layer in the green pixel, a blue-light luminous layer is a luminous layer in the blue pixel.

* * * * *